United States Patent
Isojima et al.

(10) Patent No.: US 10,668,690 B2
(45) Date of Patent: Jun. 2, 2020

(54) OPTICAL LAYERED BODY AND DISPLAY DEVICE

(71) Applicants: DAI NIPPON PRINTING CO., LTD., Tokyo (JP); Yasuhiro Koike, Yokohama-shi, Kanagawa (JP)

(72) Inventors: Seiichi Isojima, Tokyo (JP); Takashi Kuroda, Tokyo (JP)

(73) Assignees: DAI NIPPON PRINTING CO., LTD., Tokyo (JP); Yasuhiro Koike, Kanagawa (JP)

(*) Notice: Subject to any disclaimer, the term of this patent is extended or adjusted under 35 U.S.C. 154(b) by 0 days.

(21) Appl. No.: 16/312,777

(22) PCT Filed: Jun. 30, 2017

(86) PCT No.: PCT/JP2017/024090
§ 371 (c)(1),
(2) Date: Apr. 23, 2019

(87) PCT Pub. No.: WO2018/003963
PCT Pub. Date: Jan. 4, 2018

(65) Prior Publication Data
US 2019/0255807 A1    Aug. 22, 2019

(30) Foreign Application Priority Data
Jul. 1, 2016 (JP) .................... 2016-132077

(51) Int. Cl.
*B32B 7/023* (2019.01)
*B32B 27/34* (2006.01)
(Continued)

(52) U.S. Cl.
CPC .............. *B32B 7/023* (2019.01); *B32B 7/02* (2013.01); *B32B 27/34* (2013.01); *B32B 27/36* (2013.01);
(Continued)

(58) Field of Classification Search
None
See application file for complete search history.

(56) References Cited

U.S. PATENT DOCUMENTS 6,476,893 B1* 11/2002 Sasaki ................ B32B 9/00
349/119
6,867,834 B1* 3/2005 Coates .............. G02F 1/133632
349/117
(Continued)

FOREIGN PATENT DOCUMENTS

CN      104516043      4/2015
JP      2004-047128    2/2004
(Continued)

OTHER PUBLICATIONS

JP 2007-079337 A (published Mar. 29, 2007) (Takahashi) English machine translation via Google. (Year: 2007).*
(Continued)

*Primary Examiner* — Vivian Chen
(74) *Attorney, Agent, or Firm* — Hamre, Schumann, Mueller & Larson, P.C.

(57) ABSTRACT

The present invention provides: an optical laminate comprising at least two films, the optical laminate comprising at least a film A satisfying a given condition (1) and a film C satisfying a given condition (2), wherein a retardation value Re(0) observed in a direction of an axis perpendicular to a plane of the optical laminate is 4,000 to 30,000 nm, and a retardation value Re(40) observed in a direction of an axis tilted from the axis perpendicular to the plane of the optical laminate toward a slow axis by 40 degrees in a plane lying perpendicular to the plane of the optical laminate and extending along the slow axis is 4,000 to 25,000 nm, the slow axis being an axis along which refractive index is highest in a plane of the film A; and a display device comprising the optical laminate.

8 Claims, 1 Drawing Sheet

US 10,668,690 B2

Page 2

(51) Int. Cl.

| | | |
|---|---|---|
| *B32B 27/36* | (2006.01) | |
| *G02B 5/30* | (2006.01) | |
| *G09F 9/30* | (2006.01) | |
| *H01L 27/32* | (2006.01) | |
| *H01L 51/50* | (2006.01) | |
| *H05B 33/02* | (2006.01) | |
| *B32B 7/02* | (2019.01) | |
| *B32B 27/28* | (2006.01) | |
| *B32B 27/30* | (2006.01) | |
| *B32B 27/32* | (2006.01) | |
| *B32B 27/08* | (2006.01) | |
| *H01L 51/52* | (2006.01) | |
| *G02B 1/04* | (2006.01) | |
| *G02F 1/13363* | (2006.01) | |
| *G02F 1/1333* | (2006.01) | |
| *G02F 1/1335* | (2006.01) | |

(52) U.S. Cl.
CPC .............. *G02B 5/30* (2013.01); *G02B 5/305* (2013.01); *G09F 9/301* (2013.01); *H01L 27/32* (2013.01); *H01L 51/50* (2013.01); *H01L 51/5012* (2013.01); *H05B 33/02* (2013.01); *B32B 27/08* (2013.01); *B32B 27/28* (2013.01); *B32B 27/281* (2013.01); *B32B 27/285* (2013.01); *B32B 27/30* (2013.01); *B32B 27/308* (2013.01); *B32B 27/32* (2013.01); *B32B 27/325* (2013.01); *B32B 27/365* (2013.01); *B32B 2250/03* (2013.01); *B32B 2307/40* (2013.01); *B32B 2307/412* (2013.01); *B32B 2307/418* (2013.01); *B32B 2307/42* (2013.01); *B32B 2323/00* (2013.01); *B32B 2333/00* (2013.01); *B32B 2367/00* (2013.01); *B32B 2369/00* (2013.01); *B32B 2371/00* (2013.01); *B32B 2377/00* (2013.01); *B32B 2379/08* (2013.01); *B32B 2457/20* (2013.01); *B32B 2457/206* (2013.01); *G02B 1/04* (2013.01); *G02B 5/3083* (2013.01); *G02F 1/1333* (2013.01); *G02F 1/1335* (2013.01); *G02F 1/13363* (2013.01); *G02F 1/133634* (2013.01); *H01L 27/3206* (2013.01); *H01L 51/5281* (2013.01); *H01L 51/5293* (2013.01); *Y10T 428/24942* (2015.01); *Y10T 428/31507* (2015.04); *Y10T 428/31721* (2015.04); *Y10T 428/31725* (2015.04); *Y10T 428/31786* (2015.04); *Y10T 428/31935* (2015.04); *Y10T 428/31938* (2015.04); *Y10T 428/31942* (2015.04)

(56) References Cited

U.S. PATENT DOCUMENTS

| | | | |
|---|---|---|---|
| 7,456,918 | B2 | 11/2008 | Skjonnemand |
| 7,582,227 | B2* | 9/2009 | Verall ........................ C08J 5/18 252/299.01 |
| 8,094,271 | B2* | 1/2012 | Aiki .................. G02F 1/133516 349/106 |
| 10,054,816 | B2 | 8/2018 | Koike et al. |
| 2001/0030726 | A1* | 10/2001 | Yoshida ............ G02F 1/133634 349/117 |
| 2004/0066482 | A1* | 4/2004 | Tanaka .................. G02B 5/3083 349/141 |
| 2004/0212766 | A1* | 10/2004 | Kashima .............. G02B 5/3016 349/117 |
| 2004/0233362 | A1* | 11/2004 | Kashima ............... G02F 1/1323 349/117 |
| 2005/0162592 | A1* | 7/2005 | Hirakata ........... G02F 1/133632 349/119 |
| 2005/0218768 | A1 | 10/2005 | Saito |
| 2006/0033850 | A1* | 2/2006 | Skjonnemand ... G02F 1/133632 349/13 |
| 2006/0066787 | A1* | 3/2006 | Yoda .................... G02F 1/13363 349/119 |
| 2006/0221282 | A1* | 10/2006 | Suemasu ............. G02F 1/13363 349/117 |
| 2006/0246231 | A1* | 11/2006 | Koishi ............... C09K 19/3852 428/1.3 |
| 2007/0002233 | A1* | 1/2007 | Yano ..................... G02B 5/3025 349/117 |
| 2007/0035682 | A1* | 2/2007 | Ito ....................... G02F 1/13363 349/98 |
| 2007/0036918 | A1* | 2/2007 | Kashima ................ C09K 19/38 428/1.31 |
| 2007/0159581 | A1* | 7/2007 | Moriya ............. G02F 1/133514 349/117 |
| 2007/0285603 | A1* | 12/2007 | Nakayama ................. C08J 5/18 349/118 |
| 2008/0049179 | A1* | 2/2008 | Kawamoto ........ B29D 11/0073 349/119 |
| 2008/0088780 | A1* | 4/2008 | Nakatsugawa ..... G02F 1/13363 349/118 |
| 2008/0170294 | A1* | 7/2008 | Kuroda ............... G02B 5/3016 359/487.05 |
| 2009/0066886 | A1* | 3/2009 | Shimizu ................ G02B 5/305 349/96 |
| 2009/0096962 | A1* | 4/2009 | Shelton ..................... C08B 3/06 349/96 |
| 2009/0128759 | A1* | 5/2009 | Yoshimi ............ G02F 1/133634 349/118 |
| 2009/0251642 | A1* | 10/2009 | Nakamura ........... G02B 5/3016 349/75 |
| 2010/0003490 | A1 | 1/2010 | Iida et al. |
| 2010/0165264 | A1 | 7/2010 | Kitagawa et al. |
| 2013/0100378 | A1 | 4/2013 | Murata et al. |
| 2015/0205028 | A1* | 7/2015 | Kobayashi ........... G02B 5/3083 359/489.02 |
| 2016/0007441 | A1 | 1/2016 | Matsueda |
| 2017/0152358 | A1 | 6/2017 | Koh et al. |
| 2017/0222177 | A1 | 8/2017 | Matsueda |
| 2017/0261794 | A1 | 9/2017 | Murata et al. |
| 2018/0037680 | A1* | 2/2018 | Saito ........................ B32B 7/02 |
| 2018/0159069 | A1 | 6/2018 | Matsueda |
| 2018/0173038 | A1 | 6/2018 | Murata et al. |

FOREIGN PATENT DOCUMENTS

| | | | |
|---|---|---|---|
| JP | 2004-250569 | | 9/2004 |
| JP | 2005-317507 | | 11/2005 |
| JP | 2006503315 | A | 1/2006 |
| JP | 2006-047882 | A * | 2/2006 |
| JP | 2008-112124 | | 5/2008 |
| JP | 2008-206207 | | 9/2008 |
| JP | 2008275812 | A | 11/2008 |
| JP | 2008-297360 | | 12/2008 |
| JP | 2009-069282 | A * | 4/2009 |
| JP | 2010-266777 | | 11/2010 |
| JP | 2011107198 | A | 6/2011 |
| JP | 2014-153557 | | 8/2014 |
| JP | 2014-157231 | | 8/2014 |
| JP | 2014-157238 | | 8/2014 |
| JP | 2014-157238 | A * | 8/2014 |
| JP | 2015-132691 | A * | 7/2015 |
| JP | 2015132691 | A | 7/2015 |
| JP | 2015-170502 | | 9/2015 |
| JP | 2015-207377 | | 11/2015 |
| JP | 2016-015618 | | 1/2016 |
| JP | 2016-027146 | | 2/2016 |
| JP | 2016-075852 | | 5/2016 |
| JP | 2017-105069 | | 6/2017 |
| JP | 2017-105069 | A * | 6/2017 |
| TW | 200907510 | | 2/2009 |
| WO | 2011/162198 | | 12/2011 |

(56) References Cited

FOREIGN PATENT DOCUMENTS

WO     2017099125 A1    6/2017
WO   WO 2017/099125 A  *  6/2017

OTHER PUBLICATIONS

JP 2009-116339 A (published May 28, 2009) (Sawada et al) English machine translation via Google. (Year: 2009).*

International Search Report issued for International Patent Application No. PCT/JP2017/024090, dated Sep. 26, 2017, 5 pages including English translation.

Office Action issued for Japanese patent application No. 2018-525287, dated Nov. 19, 2019, 13 pages including English translation.

* cited by examiner

OPTICAL LAYERED BODY AND DISPLAY DEVICE

TECHNICAL FIELD

The present invention relates to an optical laminate and a display device.

BACKGROUND ART

Display devices typified by liquid crystal display devices have been rapidly improving in performance such as in brightness, resolution, and color gamut. In proportion to the improvement in performance, display devices intended for outdoor use such as portable information terminals and car navigation systems are becoming widespread.

In an environment such as an outdoor space under strong sunshine, a display device may be viewed by a user wearing sunglasses having polarizing function for glare reduction (such sunglasses will be referred to as "polarization sunglasses" hereinafter).

When a display device incorporating a polarizing plate is viewed through polarization sunglasses, the following problems may arise: the polarized light absorption axis of the display device and the polarized light absorption axis of the polarization sunglasses become orthogonal to each other, and consequently the displayed image become darkened and invisible (this phenomenon will be referred to as "blackout" hereinafter); and gradational color unevenness (also simply referred to as "color unevenness" hereinafter) occur due to retardation induced by an optical film disposed in the display device.

PTL 1 proposes means for solving these problems.

CITATION LIST

Patent Literature

PTL 1: JP 2011-107198 A

SUMMARY OF INVENTION

Technical Problem

PTL 1 describes a liquid crystal display device employing white light-emitting diodes (white LEDs) as a light source for the backlight, the liquid crystal display device being characterized in that a polymer film having a retardation of 3000 to 30000 nm is disposed at a given angle on the viewer side of a polarizing plate. The means of PTL 1 solves the problems of blackout and color unevenness in liquid crystal display devices employing white light-emitting diodes (white LEDs) as a light source for the backlight.

For display devices, a wide variety of light sources and display components have been developed in order to improve the properties such as brightness, resolution, and color gamut. For example, white LEDs as used in PTL 1 are often employed as a light source for backlights of liquid crystal display devices. In recent years, liquid crystal display devices have been proposed which employ quantum dots as a light source for the backlight. The current mainstream display components are liquid crystal display components, and organic EL display components are also becoming widely used in practice.

However, when these display devices are viewed through polarization sunglasses, a problem may arise with color reproducibility even if the problems previously mentioned (blackout and color unevenness) do not occur. The problem with color reproducibility refers to a phenomenon where color appearance differs between the display device as viewed with the naked eye and the display device as viewed through polarization sunglasses.

Touch panel-equipped display devices, which nowadays are rapidly becoming widespread, may be required to be foldable, and organic EL display components are suitable as display components for use in such display devices.

Optical films for use in foldable display devices need to have not only high hardness but also high folding durability sufficient to avoid cracking which could otherwise be caused by repeated folding.

To impart folding durability to an optical film, the use of a polyimide film as a base film of the optical film has been investigated. However, it has been found that when a display device having a display component, a polarizer, and a polyimide film in order is viewed through polarization sunglasses, in particular in an oblique direction, the above-described problem with color reproducibility becomes evident.

Polyimide films are films having a so-called negative C-plate property. A "film having the negative C-plate property" refers to a film satisfying the relationship $n_x \geq n_y > n_z$, where $n_x$ denotes a refractive index in the direction of a slow axis along which refractive index is highest in the plane of the film, $n_y$ denotes a refractive index in the direction of a fast axis orthogonal to the slow axis in the plane of the film, and $n_z$ denotes a refractive index in the thickness direction of the film. Display devices having a display component and a polarizer and employing a polyimide film having the negative C-plate property as a sole optical film are never free of the problem of blackout.

It is an object of the present invention to provide an optical laminate to be used on the viewer side of a display device having a display component and a polarizer in order, the optical laminate being capable, even when including a film having the negative C-plate property such as a polyimide film, of allowing the display screen to exhibit good level of the above-described color reproducibility regardless of whether the screen is viewed in a front direction or an oblique direction, the optical laminate being further capable of solving the problem of blackout. It is also an object of the present invention to provide a display device having the optical laminate.

Solution to Problem

The present inventors have found that the above problems can be solved by an optical laminate comprising at least two different particular films and designed to satisfy given optical requirements as a whole.

The present invention provides the following optical laminate and display device.

[1] An optical laminate comprising at least two films, the optical laminate comprising at least a film A satisfying the following condition (1) and a film C satisfying the following condition (2), wherein a retardation value Re(0) observed in a direction of an axis perpendicular to a plane of the optical laminate is 4,000 to 30,000 nm, and a retardation value Re(40) observed in a direction of an axis tilted from an axis perpendicular to a plane of the optical laminate toward a slow axis by 40 degrees in a plane lying perpendicular to the plane of the optical laminate and extending along the slow axis is 4,000 to 25,000 nm, the slow axis being an axis along which refractive index is highest in a plane of the film A:

condition (1): a relationship $n_x > n_y \geq n_z$ is satisfied, where $n_x$ denotes a refractive index in a direction of a slow axis along which refractive index is highest in a plane of the film, $n_y$ denotes a refractive index in a direction of a fast axis orthogonal to the slow axis in the plane of the film, and $n_z$ denotes a refractive index in a thickness direction of the film; and condition (2): a relationship $n_x \geq n_y > n_z$ is satisfied, where $n_x$ denotes a refractive index in a direction of a slow axis along which refractive index is highest in a plane of the film, $n_y$ denotes a refractive index in a direction of a fast axis orthogonal to the slow axis in the plane of the film, and $n_z$ denotes a refractive index in a thickness direction of the film.

[2] The optical laminate according to [1], wherein the film C is selected from the group consisting of a polyimide film and a polyaramid film.

[3] The optical laminate according to [1] or [2], wherein the film A is an oriented polyester film.

[4] A display device comprising, in order, at least a display component, a polarizer, and the optical laminate according to any one of [1] to [3].

[5] The display device according to [4], wherein the display component is an organic EL display component.

[6] The display device according to [5], wherein the organic EL display component is an organic EL display component of three-color independent type.

[7] The display device according to any one of [4] to [6], wherein the film C in the optical laminate is disposed so as to be closer to a viewer than the film A.

[8] The display device according to any one of [4] to [7], being a foldable display device.

Advantageous Effects of Invention

The optical laminate of the present invention is used on the viewer side of a display device having a display component and a polarizer in order and allows the display screen as viewed through polarization sunglasses to exhibit good color reproducibility with minimal difference in color appearance from the display screen as viewed without polarization sunglasses, regardless of whether the screen is viewed in a front direction or an oblique direction. Additionally, it is possible for the optical laminate to solve the problem of blackout which would otherwise arise when a display screen is viewed through polarization sunglasses. The optical laminate of the present invention is suitable as an optical film for use on an outermost surface of a foldable display device.

DESCRIPTION OF EMBODIMENTS

[Optical Laminate]

Figure 1:
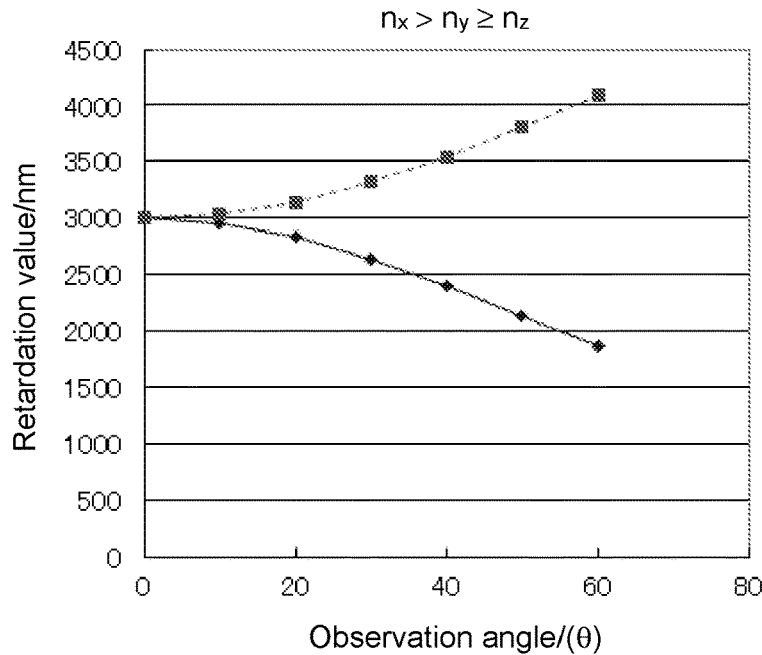
FIG. 1 shows retardation values of a film A satisfying the condition (1) at different angles of 0 degrees with respect to an axis perpendicular to the film plane, where the retardation value observed in the direction of the perpendicular axis is 3,000 nm.

An optical laminate of the present invention comprises at least two films including a film A satisfying the following condition (1) and a film C satisfying the following condition (2), the optical laminate being characterized in that a retardation value Re(0) observed in the direction of an axis perpendicular to the plane of the optical laminate is 4,000 to 30,000 nm, and a retardation value Re(40) observed in the direction of an axis tilted from an axis perpendicular to a plane of the optical laminate toward a slow axis by 40 degrees in a plane lying perpendicular to the plane of the optical laminate and extending along the slow axis is 4,000 to 25,000 nm, the slow axis being an axis along which refractive index is highest in the plane of the film A.

Condition (1): The relationship $n_x > n_y \geq n_z$ is satisfied, where $n_x$ denotes a refractive index in the direction of a slow axis along which refractive index is highest in the plane of the film, $n_y$ denotes a refractive index in the direction of a fast axis orthogonal to the slow axis in the plane of the film, and $n_z$ denotes a refractive index in the thickness direction of the film.

Condition (2): The relationship $n_x \geq n_y > n_z$ is satisfied, where $n_x$ denotes a refractive index in the direction of a slow axis along which refractive index is highest in the plane of the film, $n_y$ denotes a refractive index in the direction of a fast axis orthogonal to the slow axis in the plane of the film, and $n_z$ denotes a refractive index in the thickness direction of the film.

Being configured as defined above, the optical laminate of the present invention is capable, when used on the viewer side of a display device having a display component and a polarizer in order, of imparting properties derived from the film C, which has the negative C-plate property and satisfies the condition (2) (the properties to be imparted is, for example, folding durability when the film C is a polyimide film), and allowing the display screen as viewed through polarization sunglasses to exhibit good level of the above-described color reproducibility regardless of whether the screen is viewed in a front direction or an oblique direction. The optical laminate is further capable of resolving the above-described blackout problem.

The retardation value Re(0) observed in the direction of the axis perpendicular to the plane of the optical laminate is expressed by the following equation using the refractive index $n_x$ in the direction of the slow axis along which refractive index is highest in the plane of the optical laminate, the refractive index $n_y$ in the direction of the fast axis orthogonal to the slow axis in the plane of the optical laminate, and the thickness d of the optical laminate.

Retardation value $Re(0) = (n_x - n_y) \times d$

The retardation value can be measured, for example, with "KOBRA-WR", a phase-difference measurement apparatus available from Oji Scientific Instruments Co., Ltd., "PAM-UHR100", an ultrahigh phase-difference measurement apparatus available from Oji Scientific Instruments Co., Ltd., or "RETS-100", a phase-difference measurement apparatus available from Otsuka Electronics Co., Ltd. Retardation values as described herein are retardation values at a wavelength of 550 nm, unless otherwise specified.

Additionally, the direction of the orientation axis (the direction of the principal axis) of the optical laminate is determined using two or more polarizers, and subsequently the refractive indices ($n_x$, $n_y$) along the two axes (the orientation axis and an axis orthogonal to the orientation axis) are determined with an Abbe's refractometer (NAR-4T, available from Atago Co., Ltd.). The axis along which a higher refractive index is observed is defined herein as the slow axis. The thickness d of the optical laminate can be determined, for example, by measuring the thickness of the optical laminate at 10 points on a cross-sectional image obtained with a scanning transmission electron microscope (STEM) and calculating the average of the values measured at the 10 points. The accelerating voltage of the STEM is preferably 10 kV to 30 kV, and the magnification of the STEM is preferably 100 to 700 times. The retardation value can also be calculated as the product of the birefringence index ($n_x-n_y$) and the thickness d (nm) of the optical laminate.

The retardation value Re(40) is a retardation value observed in the direction of an axis tilted from the axis perpendicular to the plane of the optical laminate toward the slow axis of the film A of the optical laminate by 40 degrees in a plane lying perpendicular to the plane of the optical laminate and extending along the slow axis of the film A. For determination of Re(40), light is made incident on the optical laminate at an angle of 40 degrees to the axis perpendicular to the plane of the optical laminate, and a retardation value in the direction of an axis tilted from an axis perpendicular to a light emitting surface of the optical laminate toward the slow axis of the film A by 40 degrees is measured at the light emitting surface of the optical laminate using a phase-difference measurement apparatus. Specifically, the retardation value can be measured by the method described in Examples.

Further, the retardation value in the thickness direction of the optical laminate, Rth, is expressed by the following equation using the refractive index $n_x$ in the direction of the slow axis along which refractive index is highest in the plane of the optical laminate, the refractive index $n_y$ in the direction of the fast axis orthogonal to the slow axis in the plane of the optical laminate, the refractive index $n_z$ in the thickness direction of the optical laminate, and the thickness d of the optical laminate.

$$Rth=[\{(n_x+n_y)/2\}-n_z]\times d$$

The retardation values and thicknesses of all the films included in the optical laminate can be measured or calculated by the methods as described above.

Hereinafter, the present invention will be described.

In a display device having, in order, a display component, a polarizer, and an optical laminate, color appearance on the display screen may differ depending on whether the screen is viewed through or without polarization sunglasses. This is partly because of the retardation of the optical laminate and the wavelength dependence of birefringence. This is also partly because of the observed retardation values varying according to the angle at which the optical laminate is viewed.

In many cases, a person views a display device in such a manner that the line of sight becomes perpendicular to the display screen. When the display screen is viewed in this manner, the line of sight is perpendicular to the central region of the display screen, while the line of sight forms an angle with the edge region of the display screen. In other words, when a person views a display device, regions with different retardation values exist in the field of vision (to be more precise, the retardation value continuously varies in the field of vision). When a plurality of persons view one and the same display screen, each person views a region with a different retardation value.

First of all, the optical laminate of the present invention comprises the film C satisfying the condition (2) for impartation of properties such as folding durability.

For the film C satisfying the condition (2), there is no or extremely small retardation observed in the direction of the axis perpendicular to the film plane (this retardation will be also referred to as "retardation in the in-plane direction of the film" or "in-plane retardation" hereinafter), while a retardation exists in the thickness direction of the film.

Assume that a display device X having a laminate consisting of, in order, a display component, a polarizer, and the film C is produced and the display screen of the display device X is viewed from the viewer side, i.e., the film C-side, of the display device X. If the display device X is viewed without polarization sunglasses, light passing through the film C is perceived by the viewer's eye. If the display device X is viewed through polarization sunglasses, light passing through the film C and then through the polarization sunglasses is perceived by the viewer's eye. The polarization sunglasses act as a light receiving-side polarizer (analyzer).

When the display device X is viewed in front (in the direction of the perpendicular axis), color appearance on the display screen is almost the same regardless of the presence or absence of polarization sunglasses, because the retardation value of the film C as observed in this direction is extremely small.

By contrast, when the display device X is viewed in an oblique direction, color appearance may significantly vary depending on the presence or absence of polarization sunglasses. This is because when the film C is viewed in an oblique direction (the direction of an axis tilted from the axis perpendicular to the plane of the film C), a certain or higher retardation value is observed due to the retardation in the thickness direction of the film C, and this retardation value causes the shape of the spectrum of light perceived by the viewer's eye to vary depending on whether the display device X is viewed without or through polarization sunglasses.

If the retardation value observed for the film C as viewed in an oblique direction is considerably large, the difference in color appearance on the display screen is not visually perceived even when the display screen is viewed through polarization sunglasses. However, except for this case, the retardation value observed for the film C as viewed in an oblique direction causes the color appearance on the display screen to vary depending on the presence or absence of polarization sunglasses.

When a display device X having only the film C on the viewer's side is viewed in a front direction, blackout occurs at an angle at which the polarized light absorption axis of the display device X and the polarized light absorption axis of polarization sunglasses are orthogonal.

The problem as described above should be solved when, for example, the film C such as a polyimide film which satisfies the condition (2) needs to be used to impart a property such as folding durability to an optical laminate.

The optical laminate of the present invention is characterized by comprising the film A satisfying the condition (1) in addition to the film C. The film A is a film having a so-called positive A-plate property. For this film, a retardation exists which is observed in the direction of the axis perpendicular to the film plane (retardation in the in-plane direction of the film), while there is no or extremely small retardation in the thickness direction of the film. The inclusion of the film A having a retardation in its in-plane direction enables the optical laminate of the present invention to solve the above-described problem of blackout. This is because linearly polarized light, to which emitted light from the display component is converted by passing through a polarizer, experiences disturbance of polarization when passing through the film A.

However, if the retardation in the in-plane direction of the film A is not large enough, the shape of the spectrum of light perceived by the viewer's eye varies depending on the presence or absence of polarization sunglasses, and consequently the color reproducibility described above deteriorates.

When the film A is viewed at an angle of tilt from the perpendicular axis toward the $n_x$ axis (the slow axis), the larger the angle of tilt is, the smaller the retardation value is. FIG. 1 shows an example of retardation (solid line of FIG. 1) of the film A satisfying the condition (1) for different θ degrees of angle of tilt from the axis perpendicular to the film plane in the direction of $n_x$ (toward the slow axis), where the retardation value observed in the direction of the perpendicular axis is 3,000 nm. FIG. 1 also shows an example of retardation (dashed line of FIG. 1) for different θ degrees of angle of tilt from the perpendicular axis toward the $n_y$ axis (toward the fast axis). FIG. 1 demonstrates that when the film A satisfying the relationship $n_x > n_y \geq n_z$ is viewed at an angle of tilt from the perpendicular axis toward the $n_x$ axis, the retardation value decreases with increasing tilt angle.

Specifically, for the film A, the retardation value observed in the direction of an axis tilted from the perpendicular axis toward the $n_x$ axis decreases with increasing tilt angle. Thus, the inclusion of the film A in an optical laminate may be most disadvantageous in terms of the above-described color reproducibility when the optical laminate is used in a display device and its display screen is viewed in the direction of an axis tilted from the perpendicular axis toward the $n_x$ axis.

The optical laminate of the present invention is designed in consideration of the above circumstances and is based on the finding that even when an optical laminate includes both the above film A satisfying the condition (1) and the above film C satisfying the condition (2), the above-described problems underlying the present invention can be solved by configuring the optical laminate to satisfy the requirements that the retardation value Re(0) observed in the direction of the axis perpendicular to the plane of the optical laminate be 4,000 to 30,000 nm and that the retardation value Re(40) observed in the direction of an axis tilted from the axis perpendicular to the plane of the optical laminate toward the $n_x$ axis of the film A by 40 degrees be 4,000 to 25,000 nm. If Re(0) of an optical laminate is less than 4,000 nm, the optical laminate used in a display device fails to allow the display screen as viewed in front to exhibit sufficient color reproducibility. If Re(40) of an optical laminate is less than 4,000 nm, the optical laminate used in a display device fails to allow the display screen as viewed in an oblique direction to exhibit sufficient color reproducibility.

As previously described, Re(40) corresponds to a retardation value observed in a plane lying perpendicular to the plane of the optical laminate and extending along the slow axis of the film A when the optical laminate is viewed in the direction of an axis tilted from the perpendicular axis toward the $n_x$ axis of the film A by 40 degrees. The reason why the angle of tilt from the perpendicular axis is set as "the direction of an axis tilted toward the slow axis of the film A by 40 degrees" is that a display screen of a display device is rarely viewed at an angle greater than 40 degrees. For the film A, the retardation value is smallest when observed in the direction of the axis tilted from the perpendicular axis toward the slow axis; therefore, if the retardation value observed in this direction is equal to or higher than a certain value in the optical laminate, the display screen as viewed at a wide range of angles can exhibit good color reproducibility.

In order to achieve the color reproducibility as described above, Re(0) is preferably 4,000 nm or more, more preferably 5,000 nm or more, and even more preferably 7,000 nm or more. In order to avoid an excessive increase in the thickness of the optical laminate, Re(0) is preferably 20,000 nm or less and more preferably 15,000 nm or less. In view of the color reproducibility exhibited when a display device having a display component, a polarizer, and an optical laminate in order is viewed in an oblique direction, Re(40) is preferably 4,000 nm or more, more preferably 5,000 nm or more, and even more preferably 7,000 nm or more. In order to avoid an excessive increase in the thickness of the optical laminate, Re(40) is preferably 20,000 nm or less and more preferably 15,000 nm or less.

<Film A>

The film A included in the optical laminate of the present invention satisfies the following condition (1).

Condition (1): The relationship $n_x > n_y \geq n_z$ is satisfied, where $n_x$ denotes a refractive index in the direction of a slow axis along which refractive index is highest in the plane of the film, $n_y$ denotes a refractive index in the direction of a fast axis orthogonal to the slow axis in the plane of the film, and $n_z$ denotes a refractive index in the thickness direction of the film.

The retardation value in the thickness direction of the film A is not particularly limited as long as the condition (1) is satisfied. The retardation value in the thickness direction of the film A is preferably 0 nm or more.

In order to increase Re(0) and Re(40) of the optical laminate, the in-plane retardation value $R_A(0)$ of the film A is preferably 4,000 nm or more, more preferably 5,000 nm or more, and even more preferably 7,000 nm or more. In order to avoid an excessive increase in the thickness of the optical laminate, $R_A(0)$ is preferably 25,000 nm or less and more preferably 20,000 nm or less.

The thickness of the film A is not particularly limited. In order to increase Re(0) and Re(40) of the optical laminate, the thickness of the film A is preferably 5 μm or more and more preferably 10 μm or more. In order to avoid an excessive increase in the thickness of the optical laminate, the thickness of the film A is preferably 300 μm or less and more preferably 200 μm or less.

The film A is not particularly limited as long as it is any light-transmissive film satisfying the condition (1). Examples of the film A include oriented films such as a polyester film, a polycarbonate film, a cycloolefin polymer film, or an acrylic film. Among such films, an oriented polyester film is preferred in order to provide enhanced mechanical strength and increase Re(0) and Re(40) of the resulting optical laminate. Examples of the orienting include longitudinal uniaxial orienting, transverse (tenter) uniaxial orienting, sequential biaxial orienting, and simultaneous biaxial orienting. Among these, longitudinal uniaxial orienting or transverse uniaxial orienting is preferred in that the orientation of the slow axis is easily defined.

Examples of the polyester film include a polyethylene terephthalate film (PET film), a polyethylene naphthalate film (PEN film), and a polybutylene terephthalate film (PBT film).

Among the polyester films, a PET film or a PEN film is preferred, and more preferred is a PET film. These films can, even when being thin, exhibit a high in-plane retardation and thus increase Re(0) and Re(40) of the optical laminate. These films are superior in that they enable a display device to have improved color reproducibility with decrease in the overall thickness of the display device.

<Film C>

The film C included in the optical laminate of the present invention satisfies the following condition (2).

Condition (2): The relationship $n_x \geq n_y > n_z$ is satisfied, where $n_x$ denotes a refractive index in the direction of a slow axis along which refractive index is highest in the plane of the film, $n_y$ denotes a refractive index in the direction of a fast axis orthogonal to the slow axis in the plane of the film, and $n_z$ denotes a refractive index in the thickness direction of the film.

The retardation value in the in-plane direction of the film C is preferably 200 nm or less. That is, the film C may satisfy $n_x > n_y$, but also in this case the retardation value in the in-plane direction is preferably 200 nm or less. In order that a display screen of a display device having the optical laminate including the films A and C may exhibit good color reproducibility when viewed in an oblique direction, substantially only a retardation value observed in the direction of the axis tilted toward the slow axis of the film A needs to be considered for Re(40) described above. It is also unnecessary to laminate the films A and C in such a manner that their slow axes extend in the same direction.

In order to increase Re(40) of the optical laminate, the retardation value $R_C$th in the thickness direction of the film C is preferably 10 nm or more, more preferably 100 nm or more, even more preferably 200 nm or more, still even more preferably 1,000 nm or more, and still even more preferably 2,000 nm or more. In order to avoid an excessive increase in the thickness of the optical laminate, $R_C$th is preferably 10,000 nm or less and more preferably 7,000 nm or less.

The thickness of the film C is not particularly limited. In order to increase Re(40) of the optical laminate, the thickness of the film C is preferably 10 μm or more and more preferably 15 μm or more. In order to avoid an excessive increase in the thickness of the optical laminate, the thickness of the film C is preferably 150 μm or less and more preferably 100 μm or less.

In order to impart folding durability to the optical laminate, the thickness of the film C is preferably 10 to 80 μm and more preferably 15 to 60 μm.

Examples of the film C satisfying the condition (2) include films selected from the group consisting of polyimide films, polyaramid films, polyamide-imide films, and polyether ether ketone films. Among these, films selected from the group consisting of polyimide films and polyaramid films are preferred in order to impart folding durability to the optical laminate. More preferred are polyimide films.

In general, polyimide films and polyaramid films typically color (yellow) because of the aromatic ring in the molecule. However, polyimide films and polyaramid films to be used in optical laminates as in the present invention are films called "transparent polyimide" or "transparent polyaramid" the molecular skeleton of which has been modified to give increased transparency. Conventional coloring polyimide films are preferred for use as electronic materials such as in printers or electronic circuits, due to the heat resistance and flexibility of the films.

Polyimides forming polyimide films include a polyimide having a repeating structure of the following formula (I).

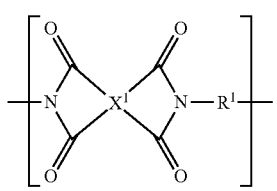

(I)

In the formula (I), $X^1$ is a tetravalent organic group and $R_1$ is a divalent organic group.

Examples of $X^1$ in the formula (I) include at least one tetravalent organic group selected from the group consisting of an acyclic aliphatic group, a cyclic aliphatic group, and an aromatic group. Examples of the cyclic aliphatic group include a monocyclic aliphatic group, a condensed polycyclic aliphatic group, a non-condensed polycyclic aliphatic group having two or more aliphatic rings linked directly or via a linking group. Examples of the aromatic group include a monocyclic aromatic group, a condensed polycyclic aromatic group, and a non-condensed polycyclic aromatic group having two or more aromatic rings linked directly or via a linking group.

Examples of the linking group include a $C_1$ to $C_{10}$ alkylene group, a $C_2$ to $C_{10}$ alkylidene group, —O—, —SO$_2$—, —CO—, and —CO—NR— wherein R is a $C_1$ to $C_3$ alkyl group or a hydrogen atom. At least one hydrogen atom of the $C_1$ to $C_{10}$ alkylene group and the $C_2$ to $C_{10}$ alkylidene group may be replaced by a fluorine-containing group. Examples of the fluorine-containing group include a fluoro group and a trifluoromethyl group.

When $X^1$ is a cyclic aliphatic group or an aromatic group, part of the carbon atoms of the group may be replaced by a heteroatom. Examples of the heteroatom include O, N, and S.

The number of carbon atoms of $X^1$ is preferably 2 to 32, more preferably 4 to 24, and even more preferably 4 to 18.

$X^1$ may have a substituent such as the fluorine-containing group described above, a hydroxy group, a sulfone group, or a $C_1$ to $C_{10}$ alkyl group. Among these substituents, the fluorine-containing group is preferred in view of the transparency of the resulting polyimide film.

In view of the folding durability of the resulting polyimide film, the tetravalent organic group denoted by $X^1$ is preferably a group containing at least one selected from the group consisting of a cyclic aliphatic group and an aromatic group and is more preferably a group selected from the group consisting of a cyclic aliphatic group and an aromatic group. In view of the transparency and folding durability of the resulting polyimide film, the tetravalent organic group denoted by $X^1$ is more preferably a group containing at least one selected from the group consisting of a cyclic aliphatic group and an aromatic group having a fluorine-containing group, even more preferably a group selected from the group consisting of a cyclic aliphatic group and an aromatic group having a fluorine-containing group, and still even more preferably an aromatic group having a fluorine-containing group.

More specific examples of $X^1$ include tetravalent groups of any of the following formulae (i) to (xi).

(i)

(ii)

(iii)

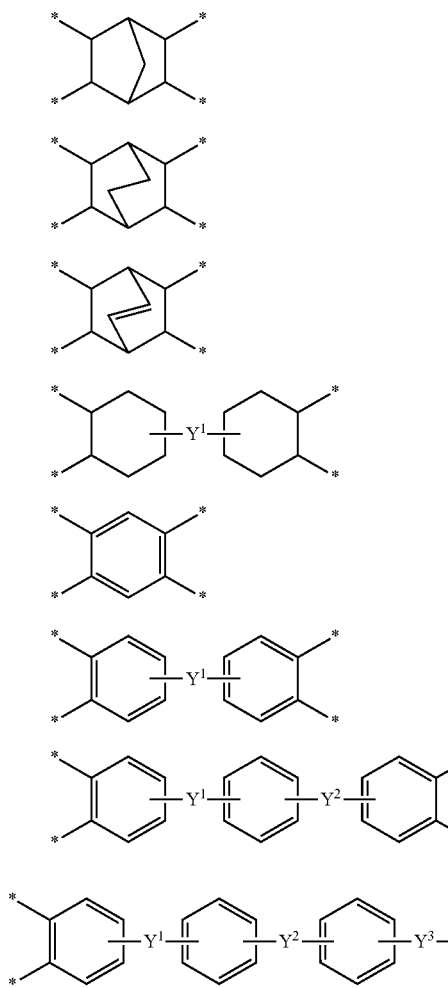

In the above formulae, $Y^1$ to $Y^3$ are each independently a single bond, —O—, —CO—, —CH$_2$—, —CH(CH$_3$)—, —C(CH$_3$)$_2$—, —CF$_2$—, —CH(CF$_3$)—, —C(CF$_3$)$_2$—, or —SO$_2$—. In the formulae, * is a linker.

In the above formulae, at least one hydrogen atom of each aliphatic ring and each aromatic ring may be replaced by a substituent such as the fluorine-containing group described above, a hydroxy group, a sulfone group, or a C$_1$ to C$_{10}$ alkyl group.

Examples of R$^1$ in the formula (I) include at least one divalent organic group selected from the group consisting of an acyclic aliphatic group, a cyclic aliphatic group, and an aromatic group. Examples of the cyclic aliphatic group include a monocyclic aliphatic group, a condensed polycyclic aliphatic group, and a non-condensed polycyclic aliphatic group having two or more aliphatic rings linked directly or via a linking group. Examples of the aromatic group include a monocyclic aromatic group, a condensed polycyclic aromatic group, and a non-condensed polycyclic aromatic group having two or more aromatic rings linked directly or via a linking group.

Examples of the linking group include a C$_1$ to C$_{10}$ alkylene group, a C$_2$ to C$_{10}$ alkylidene group, —O—, —SO$_2$—, —CO—, and —CO—NR— wherein R is a C$_1$ to C$_3$ alkyl group or a hydrogen atom. At least one hydrogen atom of the C$_1$ to C$_{10}$ alkylene group and the C$_2$ to C$_{10}$ alkylidene group may be replaced by a fluorine-containing group. Examples of the fluorine-containing group include a fluoro group and a trifluoromethyl group.

When R$^1$ is a cyclic aliphatic group or an aromatic group, part of the carbon atoms of the group may be replaced by a heteroatom. Examples of the heteroatom include O, N, and S.

The number of carbon atoms of R$^1$ is preferably 2 to 40, more preferably 4 to 32, even more preferably 5 to 24, and still even more preferably 5 to 18.

R$^1$ may have a substituent such as the fluorine-containing group described above, a hydroxy group, a sulfone group, or a C$_1$ to C$_{10}$ alkyl group. Among these substituents, the fluorine-containing group is preferred in view of the transparency of the resulting polyimide film.

In view of the folding durability of the resulting polyimide film, the divalent organic group denoted by R$^1$ is preferably a group containing at least one selected from the group consisting of a cyclic aliphatic group and an aromatic group, and more preferably a group selected from the group consisting of a cyclic aliphatic group and an aromatic group. In view of the transparency and folding durability of the resulting polyimide film, the divalent organic group denoted by R$^1$ is more preferably a group containing at least one selected from the group consisting of a cyclic aliphatic group and an aromatic group having a fluorine-containing group, even more preferably a group selected from the group consisting of a cyclic aliphatic group and an aromatic group having a fluorine-containing group, and still even more preferably an aromatic group having a fluorine-containing group.

More specific examples of R$^1$ include divalent groups of any of the following formulae (xii) to (xviii).

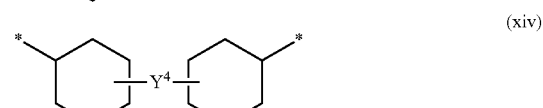

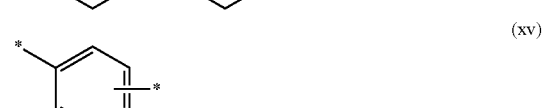

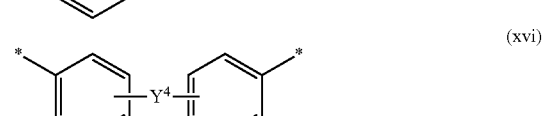

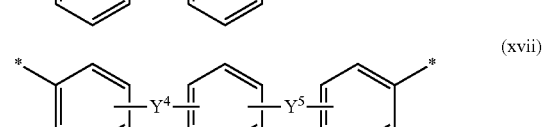

(xviii)

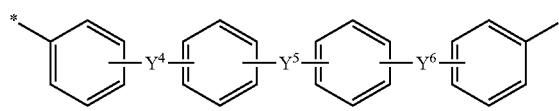

In the above formulae, $Y^4$ to $Y^6$ are each independently a single bond, —O—, —CO—, —CH$_2$—, —CH(CH$_3$)—, —C(CH$_3$)$_2$—, —CF$_2$—, —CH(CF$_3$)—, —C(CF$_3$)$_2$—, or —SO$_2$—. In the formulae, * is a linker.

In the above formulae, at least one hydrogen atom of each aliphatic ring and each aromatic ring may be replaced by a substituent such as the fluorine-containing group described above, a hydroxy group, a sulfone group, or a $C_1$ to $C_{10}$ alkyl group.

In view of the transparency of the resulting polyimide film, at least one of $X^1$ and $R^1$ in the formula (I) preferably has a fluorine-containing group.

More specific examples of the polyimide film include those having any of the structures of the following formulae (1) to (17). In the following formulae, n denotes the number of repeating units and is an integer of 2 or more.

(1)

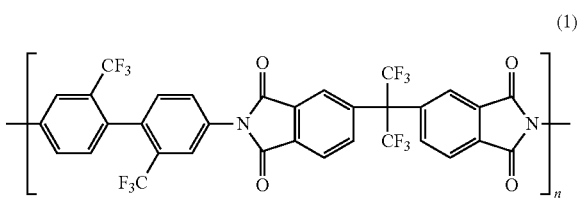

(2)

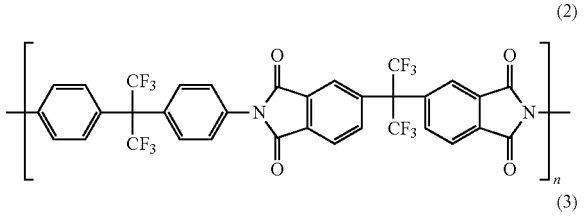

(3)

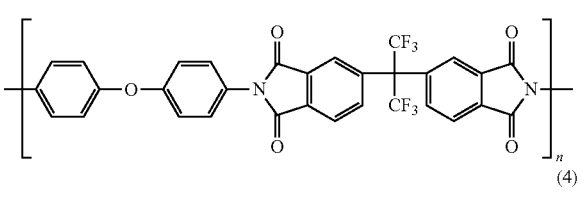

(4)

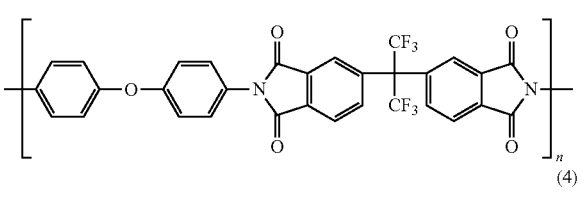

(5)

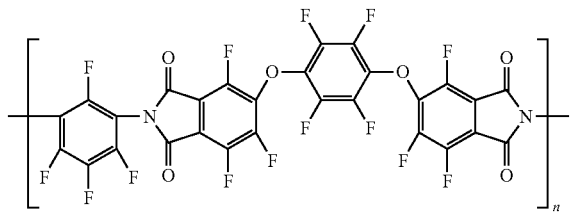

(6)

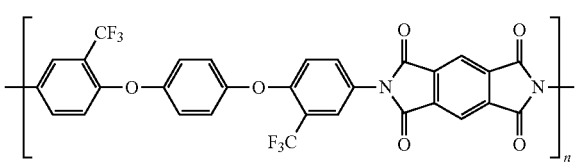

(7)

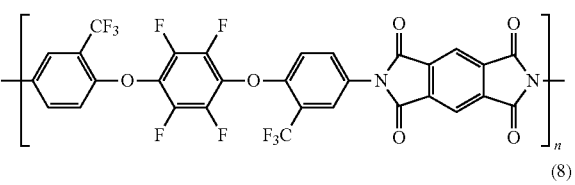

(8)

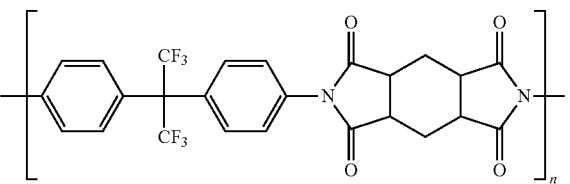

(9)

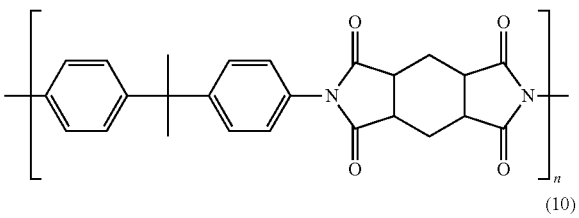

(10)

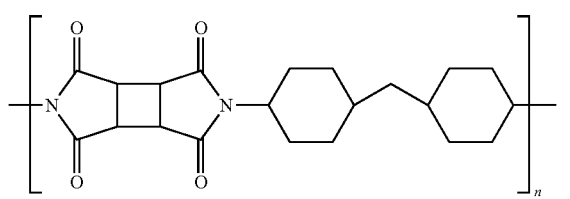

(11)

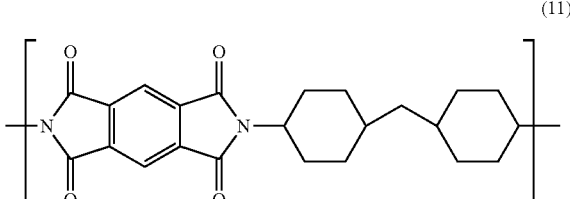

(12)

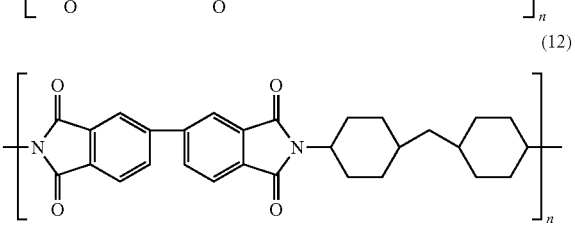

(13)

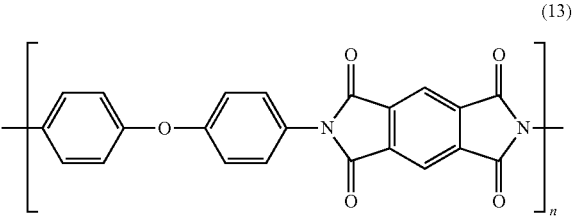

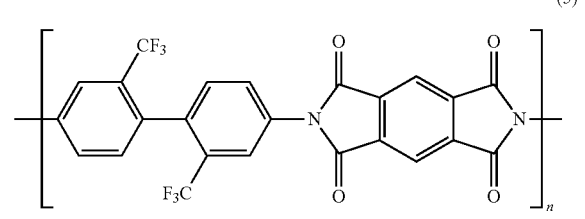

-continued

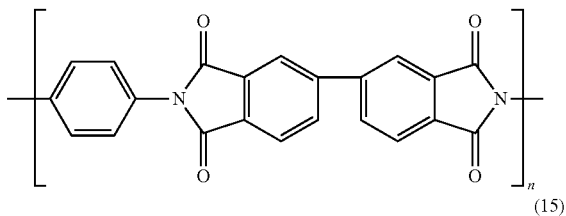

(14)

(15)

(16)

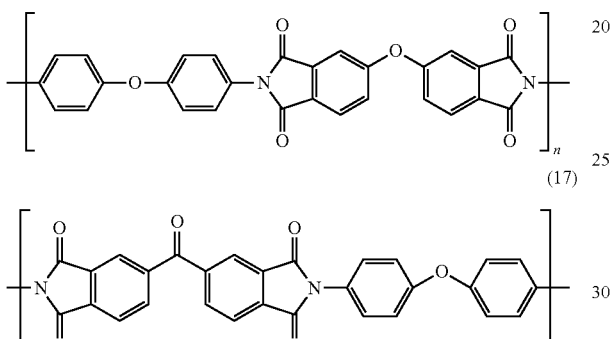

(17)

The polyimide forming the polyimide film may contain a polyamide structure in part as long as the effect of the present invention is not impaired. Examples of the polyamide structure include a polyamide-imide structure containing a repeating unit derived from a tricarboxylic acid such as trimellitic anhydride and a polyamide structure containing a repeating unit derived from a dicarboxylic acid such as isophthalic acid or terephthalic acid.

The polyaramid forming a polyaramid film typically has a structure of the following formula (18) or (19). Examples of the polyaramid forming a polyaramid film that can be used as the film C include a polyaramid having a structure of the following formula (20). In the following formulae, n denotes the number of repeating units and is an integer of 2 or more.

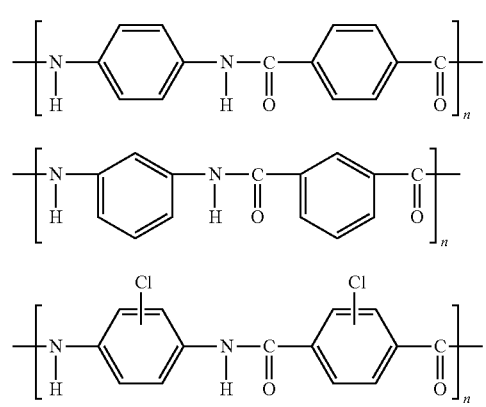

(18)

(19)

(20)

Commercially-available films may be used as the polyimide film having a structure of any of the formulae (1) to (17) and the polyaramid film having a structure of the formula (20). Examples of the commercially-available polyimide films include "Neopulim" available from Mitsubishi Gas Chemical Company, Inc., and examples of the commercially-available polyaramid films include "Mictron" available from Toray Industries, Inc.

The polyimide film and the polyaramid film may be films made of resins synthesized by known methods.

The polyimide forming the polyimide film can be typically obtained by using a known method to carry out a polycondensation reaction between a tetracarboxylic acid compound such as a tetracarboxylic anhydride and a diamine compound. For example, a method of synthesizing a polyimide resin having a structure of the formula (1) is described in JP 2009-132091 A.

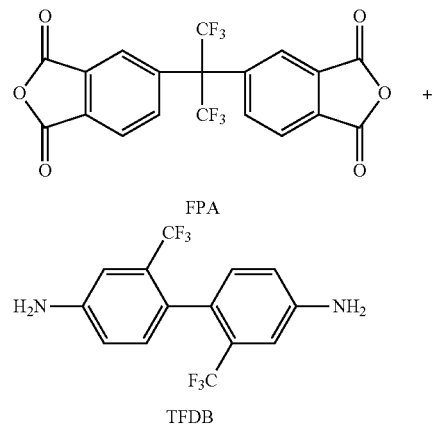

(21)

FPA

TFDB

Specifically, the polyimide resin can be obtained by reacting 4,4'-hexafluoropropylidene bisphthalic dianhydride (FPA) of the formula (21) and 2,2'-bis(trifluoromethyl)-4,4'-diaminobiphenyl (TFDB).

The weight-average molecular weight of the resin forming the polyimide film or polyaramid film is preferably in the range of 3,000 to 500,000, more preferably in the range of 5,000 to 300,000, and even more preferably in the range of 10,000 to 200,000. When the weight-average molecular weight is 3,000 or more, sufficient strength can be obtained. When the weight-average molecular weight is 500,000 or less, a film having a smooth surface and a uniform thickness can easily be obtained.

The weight-average molecular weight as described herein refers to a polystyrene-equivalent molecular weight as measured by gel permeation chromatography (GPC).

Among polyimide films and polyaramid films, a polyimide or polyaramid film having a structure less prone to intermolecular or intramolecular charge transfer is preferred because such a film has excellent transparency. Specifically, a fluorinated polyimide film having at least one structure selected from the group consisting of the structures of the formulae (1) to (8), a cyclic aliphatic group-containing polyimide film having at least one structure selected from the group consisting of the structures of the formulae (9) to (12), or a halogen group-containing polyaramid film having the structure of the formula (20) is preferred. More preferred is a fluorinated polyimide film having at least one structure selected from the group consisting of the structures of the formulae (1) to (8) or a halogen group-containing aramid film having the structure of the formula (20). Of these films, the fluorinated polyimide film has excellent transparency

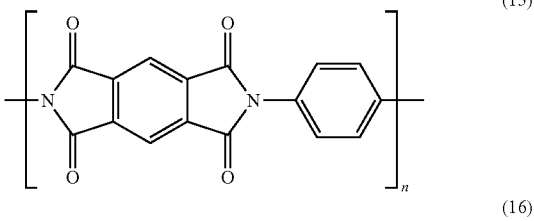

because this film has high heat resistance attributed to the fluorinated structure and does not become colored due to heat during polyimide film production.

Among such fluorinated polyimide films, a polyimide film having the structure of the formula (1) is more preferred because the use of the polyimide film can impart excellent transparency and very excellent hardness.

The optical laminate of the present invention comprises at least two films including the film A and the film C and may be embodied as a laminate having a plurality of films A and a plurality of films C. The film A and the film C may be in contact with each other or may be laminated together via another layer such as an adhesive layer.

When the optical laminate includes a plurality of films each having an in-plane retardation, these films are preferably laminated in such a manner that, in the planes of the films, the slow axes extend in substantially the same direction. "Slow axes extend in substantially the same direction" indicates that when the slow axis of a film having the largest in-plane retardation is used as a reference, the angle between the slow axis of this film and the slow axis of any of the other films is in the range of −10° to +10° (exclusive of −10° and +10°).

<Functional Layer>

The optical laminate of the present invention can further include a functional layer in addition to the films A and C described above. Examples of the functional layer include a hard coat layer, an anti-fouling layer, a conductive layer, an anti-reflection layer, an anti-glare layer, an ultraviolet absorption layer, and an anti-static layer. Among these layers, a hard coat layer is preferably included in the optical laminate for use in a foldable display device, in order to impart hardness and folding durability.

In view of mechanical strength, the hard coat layer is preferably a cured product of a curable resin composition. The curable resin composition is, for example, a thermosetting resin composition or an ionizing radiation-curable resin composition. In order to achieve improved mechanical strength, an ionizing radiation-curable resin composition is suitable. "Ionizing radiation" as described herein refers to an electromagnetic wave or a charged particle radiation having a quantum of energy sufficient for polymerization or crosslinking of molecules. Typically, ultraviolet (UV) or an electron beam (EB) is used. Alternatively, an electromagnetic wave such as X-ray or γ-ray or a charged particle radiation such as α-ray or ion ray can be used.

The ionizing radiation-curable resin composition is a composition containing a compound having an ionizing radiation-curable functional group (this compound will also be referred to as "ionizing radiation-curable compound" hereinafter). Examples of the ionizing radiation-curable functional group include: ethylenically unsaturated bond groups such as (meth)acryloyl, vinyl, and allyl groups; an epoxy group; and an oxetanyl group. The ionizing radiation-curable compound is preferably a compound having an ethylenically unsaturated bond group and more preferably a compound having two or more ethylenically unsaturated bond groups. Even more preferred is a polyfunctional (meth)acrylate having two or more (meth)acryloyl groups as the ethylenically unsaturated bond groups. The polyfunctional (meth)acrylate used may be any of a monomer, an oligomer, and a polymer.

The term "(meth)acrylate" as used herein collectively refers to a methacrylate and an acrylate.

Among polyfunctional (meth)acrylate monomers, tri- to hexafunctional (meth)acrylate monomers are preferred in order to impart high hardness to the hard coat layer, and preferred examples include pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca(meth)acrylate. One of these polyfunctional (meth)acrylate monomers may be used singly, or two or more thereof may be used in combination.

Examples of the polyfunctional (meth)acrylate oligomer include epoxy (meth)acrylate oligomer, urethane (meth)acrylate oligomer, polyester (meth)acrylate oligomer, polyether (meth)acrylate oligomer, and silicone (meth)acrylate oligomer. One of these oligomers may be used singly, or two or more thereof may be used in combination. Among these oligomers, urethane (meth)acrylate oligomer is preferred in view of the curability and the performance of the cured product. The polyfunctional (meth)acrylate oligomer is preferably a tri- or higher functional oligomer and more preferably a tri- to dodecafunctional oligomer in order to impart high hardness to the hard coat layer.

Examples of the polyfunctional (meth)acrylate polymer include polymers having a (meth)acryloyl group introduced in the side chain. The main chain of the polyfunctional (meth)acrylate polymer is preferably an acrylic polymer or a urethane polymer and more preferably an acrylic polymer. Examples of commercially-available polyfunctional (meth)acrylate polymers include 8BR series, 8KX series, and 8UH series available from Taisei Fine Chemical Co., Ltd.

A monofunctional (meth)acrylate monomer may additionally be used for the purpose of, for example, viscosity reduction as long as the mechanical strength of the cured product is not impaired.

The hard coat layer may further contain fine silica particles. The fine silica particles to be included in the curable resin composition for hard coat layer formation are preferably reactive fine silica particles. The reactive fine silica particles are fine silica particles capable of forming a cross-linked structure between them and a curable compound such as the polyfunctional (meth)acrylate described above. The inclusion of the reactive fine silica particles in the curable resin composition for hard coat layer formation can result in sufficiently increased hardness of the hard coat layer.

The reactive fine silica particles preferably have a reactive functional group on their surface, and a polymerizable unsaturated group is suitably used as the reactive functional group. The reactive functional group is more preferably a photocurable unsaturated group and particularly preferably an ionizing radiation-curable unsaturated group. Specific examples of the reactive functional group include: ethylenically unsaturated bond groups such as (meth)acryloyl, vinyl, and allyl groups; and an epoxy group.

The fine silica particles preferably have an average primary particle diameter of 5 to 200 nm. The content of the fine silica particles in the hard coat layer is preferably 5 to 60 parts by mass relative to 100 parts by mass of the resin component of the curable resin composition forming the hard coat layer.

The average primary particle diameter of the fine silica particles can be determined by the following steps (1) to (3).

(1) An image of a cross-section of the optical laminate of the present invention is obtained with a TEM or STEM. The accelerating voltage of the TEM or STEM is preferably 10 kV to 30 kV, and the magnification of the TEM or STEM is preferably 50,000 to 300,000×.

(2) 10 particles are randomly selected from the observed image, and the particle diameter of each particle is determined. The particle diameter is measured as follows: pairs of two parallel straight lines are drawn tangent to the cross-section of the particle, and a distance between a pair of two straight lines for which the line-to-line distance is largest is determined as the particle diameter.

(3) The same procedure is performed for five different observed images of the same sample, and a value calculated as the number average of the particle diameters of the total 50 particles is employed as the average primary particle diameter of the particles.

The hard coat layer or the curable resin composition for hard coat layer formation may, if necessary, contain an additional component such as a photopolymerization initiator, a photopolymerization accelerator, a slip additive, a plasticizer, a filler, an anti-static agent, an anti-blocking agent, a cross-linking agent, a light stabilizer, an ultraviolet absorber, an antioxidant, a conductive agent, a refractive index modifier, a solvent, or a colorant such as a dye or pigment.

The thickness of the hard coat layer is preferably 2.5 to 10 μm and more preferably 3.5 to 8.0 μm. When the thickness of the hard coat layer is 2.5 μm or more, good hardness is achieved. When the thickness of the hard coat layer is 10 μm or less, high processability is obtained.

The thickness of the hard coat layer can be determined, for example, by measuring the thickness of the layer at 10 points on a cross-sectional image obtained with a scanning electron microscope (STEM) and calculating the average of the values measured at the 10 points. The accelerating voltage of the STEM is preferably 10 kV to 30 kV. When the thickness to be measured is on the order of micrometers, the magnification of the STEM is preferably 1000 to 7000 times. When the thickness to be measured is on the order of nanometers, the magnification of the STEM is preferably 50,000 to 300,000 times.

The method of forming the hard coat layer is not particularly limited, and a known method can be used. For example, when the hard coat layer is a cured product of an ionizing radiation-curable resin composition, the following method may be used: a hard coat layer-forming composition containing an ionizing radiation-curable compound as described above and optionally containing fine silica particles, a photopolymerization initiator, a solvent, and an additional component if required to form a coating layer; then the coating layer is dried; and the dried layer is subsequently cured by exposure to ionizing radiation as described above.

Examples of the method of forming the coating layer include various known methods such as gravure coating, spin coating, clipping, spraying, die coating, bar coating, roll coating, meniscus coating, flexographic printing, screen printing, and bead coating. The method of drying of the coating layer is not particularly limited. In general, the drying is preferably performed at 30 to 120° C. for 10 to 120 seconds.

When the optical laminate comprises the hard coat layer, the hard coat layer is preferably provided on an outermost surface of the optical laminate. The hard coat layer is provided on at least one surface of the optical laminate. In order to impart hardness and folding durability, the hard coat layer is more preferably provided on the film C.

Figure 2:
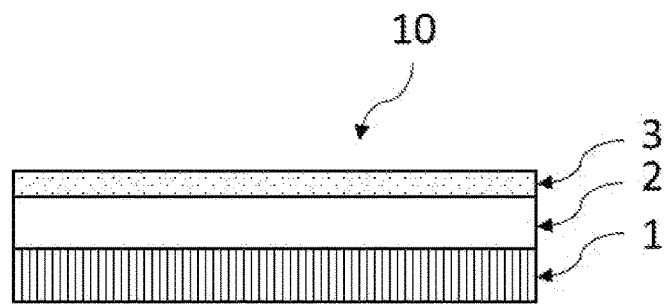
FIG. 2 is a schematic cross-sectional view illustrating an exemplary embodiment of an optical laminate of the present invention.

FIG. 2 is a schematic cross-sectional view illustrating an exemplary embodiment of the optical laminate of the present invention. In FIG. 2, the numeral 10 denotes the optical laminate of the present invention, the numeral 1 denotes the film A, the numeral 2 denotes the film C, and the numeral 3 denotes the hard coat layer. The optical laminate of the present invention may include two or more hard coat layers and, for example, the hard coat layer 3 of FIG. 2 may have a bilayer structure, although the optical laminate in such a case is not shown.

[Display Device]

A display device of the present invention is characterized by having at least a display component, a polarizer, and the above-described optical laminate in order. The display device of the present invention is preferably a foldable display device. This is because even without the use of a glass sheet or the like as a surface-protecting member for the display device, the above-described optical laminate can serve as a surface-protecting member and because the optical laminate imparts folding durability to the display device. In order for the display device of the present invention to be a foldable display device, the display devise preferably has no glass sheet.

The display device of the present invention is preferably a display device equipped with a touch panel described later.

Figure 3:
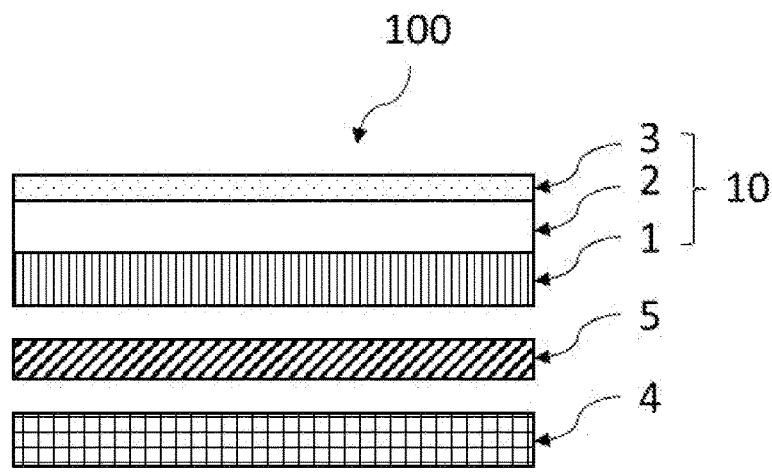
FIG. 3 is a schematic cross-sectional view illustrating an exemplary embodiment of a display device of the present invention.

FIG. 3 is a schematic cross-sectional view illustrating an exemplary embodiment of the display device of the present invention. In FIG. 3, the numeral 100 denotes the display device of the present invention, and the display device has a display component 4, a polarizer 5, and an optical laminate 10 in order. For example, when the display device 100 of the present invention is a foldable display device, the film C included in the optical laminate 10 is preferably disposed so as to be closer to the viewer than the film A, in order to impart folding durability.

In FIG. 3, the optical laminate 10 has a film A (1), a film C (2), and a hard coat layer 3 in order from the display component 4. As previously described, the hard coat layer 3 is preferably provided on the film C included in the optical laminate 10. The hard coat layer 3 is preferably disposed so as to form an outermost surface of the display device.

Hereinafter, the components of the display device of the present invention will be described.

<Display Component>

Examples of the display component include a liquid crystal display component, an organic EL display component, an inorganic EL display component, and a plasma display component. The liquid crystal display component may be an in-cell touch panel-equipped liquid crystal display component having a touch panel function in itself.

In particular, when the display device is a foldable display device, the display component is preferably an organic EL display component.

(Organic EL Display Component)

Organic EL display components are broadly classified into three types: a color conversion type, a color filter type, and a three-color independent type.

An organic EL display component of the color conversion type has a basic configuration consisting of a metal electrode, a blue light-emitting layer, fluorescent layers (a red fluorescent layer and a green fluorescent layer), a color filter (blue color filter), a transparent electrode, and a transparent substrate. In the color conversion type, light coming from the blue light-emitting layer is converted to red light and green light by the red fluorescent layer and green fluorescent layer, and blue light is passed through the color filter to achieve high intensity.

An organic EL display component of the color filter type has a basic configuration consisting of a metal electrode, a white light-emitting layer, color filters (color filters for three colors, red, green, and blue), a transparent electrode, and a transparent substrate. In the color filter type, light coming from the white light-emitting layer is converted to red light, green light, and blue light by the color filters.

An organic EL display component of the three-color independent type has a basic configuration consisting of a metal electrode, light-emitting layers (a red light-emitting layer, a green light-emitting layer, and a blue light-emitting layer are provided independently of each other), a transparent electrode, and a transparent substrate. In the three-color independent type, three primary colors, red, green, and blue, are created without the use of any color filter. The transparent substrate is preferably a plastic substrate.

Among these organic EL display components, an organic EL display component of the three-color independent type is preferred as the organic EL display component in the display device of the present invention. With the use of an organic EL display component of the three-color independent type, the spectrum of light emitted from the display component and incident on the optical laminate is prone to be sharp, and the effect of the present invention is then likely to be effectively exhibited. This is because when the light spectrum is sharper, the above-described problem with color reproducibility is more likely to occur. Organic EL display components have a problem with light extraction efficiency. To improve the light extraction efficiency, an organic EL display component of the three-color independent type is provided with a microcavity structure. In the organic EL display component of the three-color independent type which is provided with a microcavity structure, when the light extraction efficiency is higher, the spectrum of light emitted from the display component and incident on the optical laminate is sharper, and thus the effect of the present invention is more likely to be effectively exhibited.

Exemplary standards specifying the color gamut include "ITU-R Recommendation BT.2020 (also referred to as "BT.2020" hereinafter)". ITU-R is the abbreviation of "International Telecommunication Union-Radiocommunication Sector", and ITU-R Recommendation BT.2020 is an international standard for the color gamut of super hi-vision. Display components preferably have a BT.2020 coverage, expressed by the following equation based on a CIE-xy chromaticity diagram, of 60% or more, more preferably 65% or more, even more preferably 70% or more.

[Area covered by display component on CIE-xy chromaticity diagram and overlapping area covered by BT.2020 color space on CIE-xy chromaticity diagram/Area covered by BT.2020 color space on CIE-xy chromaticity diagram]× 100(%) [Equation Expressing BT.2020 Coverage]

The "area covered by display component on CIE-xy chromaticity diagram" needed for calculation of the BT.2020 coverage can be determined by measuring an x value and a y value in the CIE-Yxy color system for red color display, green color display, and blue color display and making calculation from "vertex coordinates of red", "vertex coordinates of green", and "vertex coordinates of blue" obtained from the measurement results. The x values and y values in the CIE-Yxy color system can be measured, for example, with CS-2000, a spectroradiometer available from Konica Minolta, Inc.

<Polarizer>

In the display device of the present invention, the polarizer is disposed on the light-emitting surface of the display component and located closer to the display component than the optical laminate.

Examples of the polarizer include: sheet-shaped polarizers such as a polyvinyl alcohol film, polyvinyl formal film, polyvinyl acetal film, and ethylene-vinyl acetate copolymer-based saponified film which have been dyed with iodine or the like and oriented; wire grid polarizers made up of a large number of metal wires arranged in parallel; coated polarizers coated with a lyotropic liquid crystal or a dichroic guest-host material; and multilayer thin-film polarizers. These polarizers may be reflective polarizers having the function of reflecting a polarized light component that is not transmitted through the polarizers.

Both surfaces of the polarizer are preferably covered with a transparent protective sheet such as a plastic film or glass. It is possible to use the optical laminate of the present invention as the transparent protective sheet.

When the display component is an organic EL display component, the polarizer is used, for example, in combination with a ¼λ plate to impart the anti-reflection property. A general-purpose ¼λ plate and phase-difference film can be used. The ¼λ plate is preferably located closer to the organic EL display component than the polarizer. The phase-difference film is preferably located on the organic EL display component-side of the polarizer.

When the display component is a liquid crystal display component, a back polarizer is disposed on the light-incident surface of the liquid crystal display component, and the polarizer located above the liquid crystal display component and the back polarizer located under the liquid crystal display component are arranged so that the absorption axes of the polarizers are orthogonal to each other. The polarizers thus arranged are used to impart the function of a liquid-crystal shutter.

Polarization sunglasses absorb s-polarized light in principle, and hence the absorption axis of the polarizer of polarization sunglasses extends in the horizontal direction in principle. The polarizer of the display device is therefore preferably disposed in such a manner that the angle of the direction of the absorption axis of the polarizer to the horizontal direction of the display device is in the range of −10° to +10° (exclusive of −10° and +10°). This angle is more preferably in the range of −5° to +5° (exclusive of −5° and +5°).

Two or more polarizers may be provided between the display component and the optical laminate. In this case, the polarizer and the optical laminate are preferably arranged in such a manner that the smallest angle among angles formed between the absorption axis of the polarizer and the slow axis of the film A included in the optical laminate is in the range of 35° to 55° (exclusive of 35° and 55°).

<Touch Panel>

The display device of the present invention may be a touch panel-equipped display device having a touch panel on the emitting surface of the display component.

The positional relationship between the touch panel and the optical laminate is not particularly limited. For example, the touch panel may be provided between the display component and the optical laminate or may be provided on the optical laminate. The optical laminate may be used as a component of the touch panel.

In order for the optical laminate of the present invention to impart folding durability to a foldable display device, it is preferable to configure the display device to have the touch panel between the display component and the optical laminate, or use the optical laminate as a component of the touch panel.

Examples of the touch panel include a resistive touch panel, a capacitive touch panel, an electromagnetic touch panel, an optical touch panel, and an ultrasound touch panel.

Examples of the capacitive touch panel include surface capacitive touch panels and projected capacitive touch panels, and projected capacitive touch panels are more widely used. Projected capacitive touch panels have a basic configuration consisting of an X-axis electrode, a Y-axis electrode disposed orthogonal to the X-axis electrode, and an insulator interposed between the electrodes, and have a circuit connected to the basic configuration. Specific examples of the basic configuration include: (1) a configuration in which the X-axis electrode and the Y-axis electrode are formed on different surfaces of one transparent substrate; (2) a configuration in which the X-axis electrode, the insulator layer, and the Y-axis electrode are formed in this order on a transparent substrate; and (3) a configuration in which the X-axis electrode is formed on a transparent substrate, the Y-axis electrode is formed on another transparent substrate, and the electrodes are laminated together via an adhesive agent layer or another layer. A configuration may also be employed in which still another transparent substrate is laminated on any of the above basic configurations.

Resistive touch panels have a basic configuration consisting of a pair of upper and lower transparent substrates each having a conductive film and arranged with an interposed spacer so that the conductive films face each other, and further have a circuit connected to the basic configuration.

Specific examples of configurations employing the optical laminate of the present invention as a component of the touch panel include a configuration employing the optical laminate as a transparent substrate of a capacitive touch panel as described above and a configuration employing the optical laminate as a transparent substrate as a resistive touch panel as described above.

<Backlight>

When the display device is a liquid crystal display device, a backlight is disposed on the back of the display component.

The backlight used can be either an edge-lit backlight or a direct-lit backlight.

Examples of the light source for the backlight include LEDs and CCFLs. With the use of a backlight employing quantum dots as a light source, the spectrum of light emitted from the display component and incident on the optical laminate is prone to be sharp, and the effect of the present invention is likely to be effectively achieved.

A backlight employing quantum dots as a light source is made up of at least a primary light source that emits primary light and a secondary light source consisting of quantum dots that absorb the primary light and emit secondary light.

When the primary light source emits primary light with a wavelength corresponding to blue, the quantum dots serving as the secondary light source preferably include at least either first quantum dots that absorb the primary light and emit secondary light with a wavelength corresponding to red or second quantum dots that absorb the primary light and emit secondary light with a wavelength corresponding to green and, more preferably, the quantum dots include both the first quantum dots and the second quantum dots.

Quantum dots are nanometer-sized semiconductor particles and have unique optical and electrical properties attributed to the quantum confinement effect (quantum size effect) in which electrons or excitons are confined in nanometer-sized crystals. Quantum dots are also called semiconductor nanoparticles or semiconductor nanocrystals.

The quantum dots used are not particularly limited as long as they are nanometer-sized semiconductor particles which exhibit the quantum confinement effect (quantum size effect).

The quantum dots may be contained in an optical film which is a component of the backlight.

EXAMPLES

Next, the present invention will be described in more detail with examples. The present invention is not limited in any respect by these examples.

Examples 1 to 7 and Comparative Examples 1 and 2

1. Preparation of Film A

Polyethylene terephthalate (PET) was melted at 290° C., and the melt was extruded through a film-forming die into a sheet, which was cooled by bringing it in close contact with a rotary quenching drum cooled with water. An unoriented film was thus produced. This unoriented film was set in a biaxial orienting tester (Toyo Seiki Seisaku-sho, Ltd.), in which the film was preheated at 120° C. for 1 minute and then uniaxially oriented by a factor of 4.0 at 120° C. with its one end fixed. A film A0 was thus produced. For this film A0, refractive indices at a wavelength of 550 nm were as follows: $n_x$=1.7005, $n_y$=1.6005, and $n_z$=1.5501. The refractive indices were each determined as an average of 10 measurements obtained with an Abbe's refractometer (NAR-4T, available from Atago Co., Ltd.).

The thickness of this film A0 was adjusted to obtain films A1 to A4 for which in-plane retardation values ($R_A(0)$) observed in the direction of an axis perpendicular to the film plane were as listed below. The films A1 to A4 all satisfy the condition (1), namely the relationship $n_x > n_y \geq n_z$.

Film A1: $R_A(0)$=4,000 nm
Film A2: $R_A(0)$=8,500 nm
Film A3: $R_A(0)$=12,000 nm
Film A4: $R_A(0)$=3,000 nm 2. Preparation for Film C A polyimide film (thickness: 30 μm) having a structure of the formula (1) was provided and used as a film C1.

A polyimide film (thickness: 30 μm) having a structure of the formula (5) was provided and used as a film C2.

For the films C1 and C2, the in-plane retardation values ($R_C(0)$) observed in the direction of an axis perpendicular to the film plane and the retardation values (Rcth) in the thickness direction were as listed below. The films C1 and C2 both satisfy the condition (2), namely the relationship $n_x \geq n_y > n_z$.

Film C1: $R_C(0)$=140 nm, Rcth=6,530 nm
Film C2: $R_C(0)$=157 nm, Rcth=3,400 nm

The in-plane retardation values $R_A(0)$ of the films A and the retardation values Re(0) and Re(40) of optical laminates in the present examples are retardation values measured at a wavelength of 550 nm using "PAM-UHR100", an ultrahigh phase-difference measurement apparatus available from Oji Scientific Instruments Co., Ltd. The in-plane retardation values $R_C(0)$ of the films C are retardation values measured at a wavelength of 550 nm using "RETS-100", a phase-difference measurement apparatus available from Otsuka Electronics Co., Ltd. The retardation values $R_A(0)$, $R_C(0)$, and Re(0) are values measured at an incident angle of 0 degrees, and the retardation values Re(40) are values measured at an incident angle of 40 degrees.

The thicknesses of the films and optical laminates in the present examples were each determined by measuring the thickness of the film or optical laminate at 10 points on a cross-sectional image obtained with a scanning electron microscope (STEM) and by calculating the average of the values measured at the 10 points.

The retardation values (Rcth) in the thickness direction of the films C were calculated using the following equation from the films' refractive indices and thicknesses measured by the above methods.

$$Rcth = [\{(n_x+n_y)/2\} - n_z] \times d$$

$n_x$: Refractive index in the direction of a slow axis along which refractive index is highest in the film plane $n_y$: Refractive index in the direction of a fast axis orthogonal to the slow axis in the film plane $n_z$: Refractive index $n_z$ in the thickness direction of the film d: Thickness of the film 3. Formation of Hard Coat Layer An ionizing radiation-curable resin composition for hard coat layer formation, which was composed as specified below, was applied onto one surface of the film C1 by gravure coating in such a manner that the thickness of the resulting cured layer would be 8 μm. A coating layer was thus formed. The coating layer formed was heated at 70° C. for 1 minute to evaporate the solvent in the coating layer, and then an ultraviolet irradiator (available from Fusion UV Systems Japan K.K., light source: H bulb) was used to expose the coating layer to ultraviolet under an oxygen concentration of 200 ppm or less at a total dose of 200 mJ/cm². The coating layer was thus completely cured to form a hard coat layer 1. The thickness of the hard coat layer was determined by measuring the thickness of the layer at 10 points on a cross-sectional image obtained with a scanning transmission electron microscope (STEM) and by calculating the average of the values measured at the 10 points.

(Ionizing Radiation-Curable Resin Composition for Hard Coat Layer Formation)

Urethane acrylate (UX5000, available from Nippon Kayaku Co., Ltd.): 25 parts by mass Mixture of dipentaerythritol pentaacrylate and dipentaerythritol hexaacrylate (M403, available from Toagosei Co., Ltd.): 50 parts by mass Polyfunctional acrylate polymer (ACRIT 8KX-012C, available from Taisei Fine Chemical Co., Ltd.): 25 parts by mass (on a solids basis)

Anti-fouling agent (BYK UV3500, available from BYK Japan K.K.): 1.5 parts by mass (on a solids basis)

Photopolymerization initiator (Irg 184, available from BASF Corporation): 4 parts by weight Solvent (MIBK): 150 parts by mass 4. Production of Optical Laminate The films listed in Table 1 were arranged in such a manner that the slow axes of the films extended in the same direction, and the films were laminated via an adhesive layer to produce optical laminates having configurations indicated for Examples and Comparative Examples in Table 1. For production of the optical laminate of Example 4, a film as obtained by forming the hard coat layer 1 on one surface of the film C1 in 3. was used, and a side of the film opposite to the hard coat layer 1 and the film A1 were attached via an adhesive layer to produce the optical laminate. For each of the optical laminates, the values Re(0) and Re(40) were measured by the methods described above. The results are shown in Table 1.

5. Preparation for Display Device

Display devices A, B, and C having the following configurations were provided. All components of the display devices are commercially-available products, except for the optical laminates.

<Display Device A>

A display device having a polarizer and an optical laminate that are disposed on an organic EL display component of three-color independent type, the organic EL display component being provided with a microcavity structure.

BT.2020 coverage based on CIE-xy chromaticity diagram: 77%

<Display Device B>

A display device having a polarizer and an optical laminate that are disposed on a display component, the display component being a color filter-equipped liquid crystal display component with a backlight having white LEDs as a light source.

BT.2020 coverage based on CIE-xy chromaticity diagram: 49%

<Display Device C>

A display device having a polarizer and an optical laminate that are disposed on a display component, the display component being a color filter-equipped liquid crystal display component with a backlight having blue LEDs as a primary light source and quantum dots as a secondary light source.

BT.2020 coverage based on CIE-xy chromaticity diagram: 68%

6. Evaluation

The optical laminates as produced in 5 are disposed on outermost surfaces of the display devices listed in Table 1, and evaluations as described below were conducted. In all of Examples and Comparative Examples, the film C included in the optical laminate was disposed so as to be closer to the viewer than the film A. The optical laminate was disposed in such a manner that the angle between the absorption axis of the polarizer of the display device and the slow axis of the film A included in the optical laminate was 45°.

6-1. Blackout

The screen of the display device was set to white display mode or approximately white display mode. The screen was viewed at various angles through polarization sunglasses, and whether the screen had any darkened portion was visually examined.

A: The screen is free of darkened portions.

C: The screen has a darkened portion.

6-2. Color Reproducibility

The screen of the display device was set to color display mode. The screen was viewed both in a front direction and in an oblique direction under a situation where the viewer wore polarization sunglasses (situation 1) and under a situation where the viewer did not wear the polarization sunglasses, but a glass sheet dyed in the same color as the polarization sunglasses was placed on the screen (situation 2). The color reproducibility of the screen as viewed through the polarization sunglasses was visually evaluated.

The evaluation was made by 20 viewers, who gave a score of 2 when there was no discernible difference in color between the situation 1 and the situation 2, a score of 1 when there was some discernible difference in color between the situation 1 and the situation 2, and a score of 0 where there was large discernible difference in color between the situation 1 and the situation 2. The averages of the given scores were calculated.

AA: The average score is 1.7 or more.

A: The average score is 1.5 or more and less than 1.7.

B: The average score is 1.0 or more and less than 1.5.

C: The average score is less than 1.0.

TABLE 1

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Optical laminate | Film A | A1 | A2 | A3 | A1 | A1 | A1 | A1 | — | A4 |
|  | Film C | C1 | C1 | C1 | C1 | C2 | C1 | C1 | C1 | C1 |
| Hard coat layer | Type | — | — | — | 1 | — | — | — | — | — |
|  | Thickness (μm) | — | — | — | 8 | — | — | — | — | — |
|  | Re(0) nm | 4140 | 8640 | 12140 | 4140 | 4157 | 4140 | 4140 | 140 | 3140 |
|  | Re(40) nm | 4580 | 8230 | 11080 | 4580 | 4030 | 4580 | 4580 | 1280 | 3730 |
| Configuration of display device |  | A | A | A | A | A | B | C | A | A |
| Evaluation results | Blackout | A | A | A | A | A | A | A | C | A |
|  | Color reproducibility (front direction) | A | AA | AA | A | A | AA | A | Not evaluable | A |
|  | Color reproducibility (oblique direction) | A | AA | AA | A | A | AA | A | C | B |

As seen from the results shown in Table 1, the optical laminates satisfying the requirements of the present invention can, when used in display devices, allow the display screen to exhibit good color reproducibility with minimal difference in color appearance between the presence and absence of polarization sunglasses, regardless of whether the display screen is viewed in a front direction or in an oblique direction. Additionally, the optical laminates can solve the problem of blackout.

By contrast, in Comparative Example 1 where only the film C was disposed on the viewer side of the display device, the problem of blackout was not resolved, and the color reproducibility of the display screen as viewed in an oblique direction deteriorated. In Comparative Example 1, the color reproducibility in the front direction was not able to be evaluated because blackout occurred when the display screen was viewed in the front direction. The optical laminate of the Comparative Example 2, although including the film A and the film C, failed to satisfy the given requirements and therefore had poor color reproducibility.

For the display device A used for evaluations in Examples 1 to 5 and the display device C used for evaluations in Example 7, the spectrum of light emitted from the display component and incident on the optical laminate is more prone to be sharp, and the problem with color reproducibility is more likely to occur, than for the display device B used in Example 6. Nevertheless, it is seen that the effect of the present invention was effectively achieved also in the display devices A and C. For these display devices, the higher the BT.2020 coverage based on the CIE-xy chromaticity diagram was (A, C, and B in descending order), the better the realistic feel of the displayed image was.

INDUSTRIAL APPLICABILITY

The optical laminate of the present invention is used on the viewer side of a display device having a display component and a polarizer in order and allows the display screen as viewed through polarization sunglasses to exhibit good color reproducibility with minimal difference in color appearance from the display screen as viewed without polarization sunglasses, regardless of whether the screen is viewed in a front direction or an oblique direction. Additionally, it is possible to solve the problem of blackout which would otherwise arise when a display screen is viewed through polarization sunglasses. The optical laminate of the present invention is suitable as an optical film for use on an outermost surface of a foldable display device.

REFERENCE SIGNS LIST

1 Film A
2 Film C
3 Hard coat layer
4 Display component
5 Polarizer
10 Optical laminate
100 Display device

The invention claimed is:

1. An optical laminate consisting of:

at least one film A, each film A having an in-plane retardation of 4,000 nm or more and 20,000 nm or less, film A satisfying the following condition (1) wherein film A is an oriented film selected from the group consisting of a polyester film, a polycarbonate film, a cycloolefin polymer film, and an acrylic film;

at least one film C, each film C having an in-plane retardation of 200 nm or less, and a retardation in the thickness direction of 1,000 nm or more and 10,000 nm or less, film C satisfying the following condition (2) wherein film C is selected from the group consisting of a polyimide film, a polyaramid film, a polyamide-imide film, and a polyether ether ketone film; and at least one layer selected from the group consisting of an adhesive layer, a hard coat layer, an anti-fouling layer, a conductive layer, an anti-reflection layer, an anti-glare layer, an ultraviolet absorption layer, and an anti-static layer, wherein a retardation value Re(0) observed in a direction of an axis perpendicular to a plane of the optical laminate is 4,000 to 30,000 nm, and a retardation value Re(40) observed in a direction of an axis tilted from an axis perpendicular to a plane of the optical laminate toward a slow axis by 40 degrees in a plane lying perpendicular to the plane of the optical laminate and extending along the slow axis is 4,000 to 25,000 nm, the slow axis being an axis along which refractive index is highest in a plane of the film A, condition (1): a relationship $n_x > n_y \geq n_z$ is satisfied, where $n_x$ denotes a refractive index in a direction of a slow axis along which refractive index is highest in a plane of the film, $n_y$ denotes a refractive index in a direction of a fast axis orthogonal to the slow axis in the plane of the film, and $n_z$ denotes a refractive index in a thickness direction of the film; and condition (2): a relationship $n_x \geq n_y > n_z$ is satisfied, where $n_x$ denotes a refractive index in a direction of a slow axis along which refractive index is highest in a plane of the film, $n_y$ denotes a refractive index in a direction of a fast axis orthogonal to the slow axis in the plane of the film, and $n_z$ denotes a refractive index in a thickness direction of the film.

2. The optical laminate according to claim 1, wherein the film C is selected from the group consisting of a polyimide film and a polyaramid film.

3. The optical laminate according to claim 1, wherein the film A is an oriented polyester film.

4. A display device comprising a display component, a polarizer, and the optical laminate according to claim 1 in this order.

5. The display device according to claim 4, wherein the display component is an organic EL display component.

6. The display device according to claim 5, wherein the organic EL display component is an organic EL display component of three-color independent type.

7. The display device according to claim 4, wherein the film C in the optical laminate is disposed so as to be closer to a viewer than the film A.

8. The display device according to claim 4, which is a foldable display device.

* * * * *